United States Patent
Mao et al.

(10) Patent No.: US 9,772,489 B2
(45) Date of Patent: Sep. 26, 2017

(54) DISPLAY DEVICE HAVING MEMS TRANSMISSIVE LIGHT VALVE AND METHOD FOR FORMING THE SAME

(71) Applicant: LEXVU OPTO MICROELECTRONICS TECHNOLOGY (SHANGHAI) LTD, Shanghai (CN)

(72) Inventors: Jianhong Mao, Shanghai (CN); Deming Tang, Shanghai (CN)

(73) Assignee: SHANGHAI JADIC OPTOELECTRONICS TECHNOLOGY CO., LTD., Shangai (CN)

( * ) Notice: Subject to any disclaimer, the term of this patent is extended or adjusted under 35 U.S.C. 154(b) by 599 days.

(21) Appl. No.: 14/215,076

(22) Filed: Mar. 17, 2014

(65) Prior Publication Data

US 2014/0284632 A1  Sep. 25, 2014

(30) Foreign Application Priority Data

Mar. 22, 2013 (CN) .......................... 2013 1 0095739

(51) Int. Cl.
  *G02B 26/08* (2006.01)
  *B81C 1/00* (2006.01)
  *H01L 33/10* (2010.01)

(52) U.S. Cl.
  CPC ...... *G02B 26/0841* (2013.01); *B81C 1/00246* (2013.01); *B81B 2201/047* (2013.01); *H01L 33/10* (2013.01)

(58) Field of Classification Search
  CPC ............ B81C 1/00246; B81B 2201/04; B81B 2201/042; B81B 2201/045; B81B 2201/047; G02B 26/02; G02B 26/04; G02B 26/0841; G09G 2300/0426
  See application file for complete search history.

(56) References Cited

U.S. PATENT DOCUMENTS

| | | | |
|---|---|---|---|
| 6,421,160 B2 * | 7/2002 | Ham ................... | G02B 26/0816 359/223.1 |
| 6,781,650 B1 * | 8/2004 | Colgan ............. | G02F 1/136209 349/110 |
| 7,863,155 B2 * | 1/2011 | Yamazaki ......... | H01L 21/76254 257/E21.568 |

(Continued)

*Primary Examiner* — John P Dulka
(74) *Attorney, Agent, or Firm* — Kilpatrick Townsend & Stockton LLP (57) ABSTRACT

A display device having a MEMS transmissive light valve and a method for forming the same are provided. The method includes: providing a multilayer semiconductor substrate comprising a bottom semiconductor layer, a middle buried layer and a top semiconductor layer; forming a light guide opening in the top semiconductor layer; forming at least one MOS device in a remaining part of the top semiconductor layer; forming an interconnection layer and an interlayer dielectric layer on the at least one MOS; forming a MEMS transmissive light valve, which is electrically connected to the interconnection layer, on the light guide opening, where the MEMS transmissive light valve is surrounded by the interlayer dielectric layer; forming a transparent backplane on a top surface of the interlayer dielectric layer; and removing the bottom semiconductor layer.

13 Claims, 10 Drawing Sheets

(56) References Cited

U.S. PATENT DOCUMENTS

| | | | |
|---|---|---|---|
| 8,088,670 B2* | 1/2012 | Akiyama | H01L 21/3046 257/40 |
| 8,425,880 B1* | 4/2013 | Lyczak | A01N 59/16 424/234.1 |
| 9,158,106 B2* | 10/2015 | Hagood | G02B 26/02 |
| 2002/0117728 A1* | 8/2002 | Brosnihhan | B81C 1/00142 257/446 |
| 2003/0021523 A1* | 1/2003 | De Natale | B81B 3/0083 385/18 |
| 2003/0034497 A1* | 2/2003 | Yamazaki | H01L 27/3244 257/86 |
| 2004/0150869 A1* | 8/2004 | Kasai | B81B 3/0083 359/290 |
| 2005/0006647 A1* | 1/2005 | Utsunomiya | H01L 27/1266 257/72 |
| 2006/0166463 A1* | 7/2006 | Bakke | B81C 1/00142 438/459 |
| 2007/0030555 A1* | 2/2007 | Barton | G02B 6/0043 359/291 |
| 2007/0093045 A1* | 4/2007 | Yamaguchi | B81C 1/00547 438/590 |
| 2007/0200180 A1* | 8/2007 | Irani | H01L 21/28282 257/374 |
| 2007/0218630 A1* | 9/2007 | Yamaguchi | B81B 3/001 438/257 |
| 2007/0281381 A1* | 12/2007 | Ayazi | B81C 1/00285 438/52 |
| 2008/0037104 A1* | 2/2008 | Hagood | G02B 26/00 359/292 |
| 2009/0244678 A1* | 10/2009 | Hagood, IV | G02B 26/02 359/230 |
| 2010/0140670 A1* | 6/2010 | Peczalski | B81C 1/00246 257/254 |
| 2010/0163865 A1* | 7/2010 | Arai | H01L 27/124 257/43 |
| 2011/0032246 A1* | 2/2011 | Hong | G02B 26/0841 345/214 |
| 2011/0062434 A1* | 3/2011 | Eguchi | H01L 27/12 257/43 |
| 2011/0223697 A1* | 9/2011 | Yong-Hwan | H01L 27/1266 438/28 |
| 2012/0099049 A1* | 4/2012 | Yamazaki | G02F 1/133603 349/64 |
| 2012/0206503 A1* | 8/2012 | Hirakata | H04N 13/0409 345/690 |
| 2012/0306830 A1* | 12/2012 | Kimura | B81C 1/00103 345/205 |
| 2013/0010341 A1* | 1/2013 | Hagood | G02B 26/00 359/230 |
| 2013/0120951 A1* | 5/2013 | Zuo | H01L 27/0688 361/783 |
| 2013/0306971 A1* | 11/2013 | Bedell | H01L 21/84 257/59 |
| 2013/0309791 A1* | 11/2013 | Bedell | H01L 21/84 438/28 |
| 2013/0344680 A1* | 12/2013 | Arriagada | H01L 21/02365 438/459 |
| 2014/0239353 A1* | 8/2014 | Daneman | B81C 1/00158 257/254 |
| 2014/0267979 A1* | 9/2014 | Mao | G02F 1/133536 349/62 |
| 2014/0312342 A1* | 10/2014 | Yamazaki | B81B 3/0083 257/43 |
| 2015/0069333 A1* | 3/2015 | Bedell, III | H01L 27/1218 257/40 |
| 2015/0162360 A1* | 6/2015 | Yamazaki | B81B 3/0083 257/43 |
| 2015/0270326 A1* | 9/2015 | Hekmatshoartabari | H01L 27/326 257/40 |
| 2016/0025962 A1* | 1/2016 | Kuranaga | G02B 26/02 362/293 |
| 2016/0315113 A1* | 10/2016 | Mao | H01L 27/14629 |
| 2016/0336433 A1* | 11/2016 | Ando | H01L 27/1255 |

* cited by examiner

DISPLAY DEVICE HAVING MEMS TRANSMISSIVE LIGHT VALVE AND METHOD FOR FORMING THE SAME

CROSS-REFERENCE TO RELATED APPLICATIONS

The present application claims priority to Chinese patent application No. 201310095739.0, filed on Mar. 22, 2013, and entitled "DISPLAY DEVICE HAVING MEMS TRANSMISSIVE LIGHT VALVE AND METHOD FOR FORMING THE SAME", the entire disclosure of which is incorporated herein by reference.

TECHNICAL FIELD

The present disclosure generally related to semiconductor manufacturing technology, and more particularly, to a display device having a MEMS transmissive light valve and a method for forming the same.

BACKGROUND

The conventional liquid crystal display devices have disadvantages of low light utilization rate, small view-angle range, complex structure, and high cost. Therefore, with the development of Micro Electro Mechanical Systems (MEMS) technology, MEMS transmissive light valves are used to replace liquid crystal layers in display devices, in order to control transmittance of lights emitted by a backlight for liquid crystal display. Because MEMS transmissive light valves with high speed and efficiency are used to replace the liquid crystal layers, polarizer, color filter and ITO electrode are no longer necessary, whereby optical efficiency is increased, and power consumption and manufacture cost are decreased.

Figure 1:
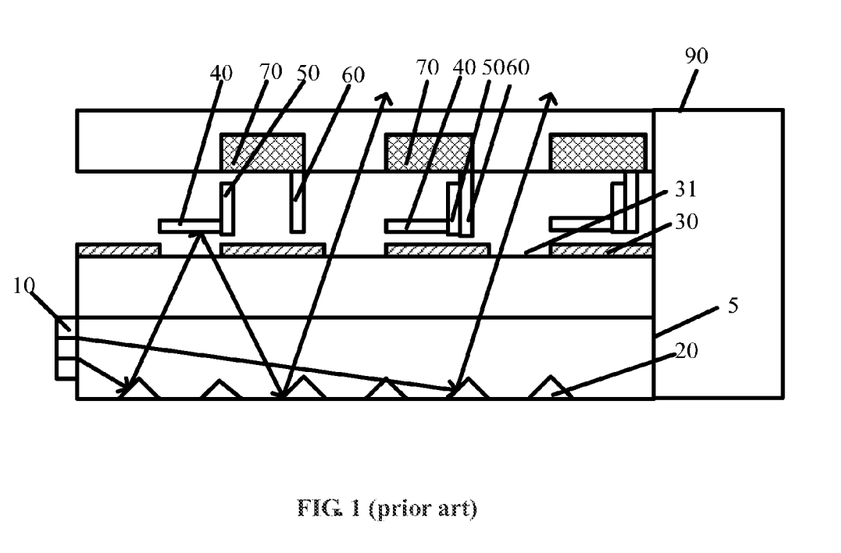
FIG. 1 illustrates a schematic structural diagram of a conventional display device having a MEMS transmissive light valve.

FIG. 1 illustrates a schematic structural diagram of a conventional display device having MEMS transmissive light valves. As shown in FIG. 1, the conventional display device includes: a glass substrate 5; a backlight 10; a reflecting mirror 20 adapted for reflecting lights emitted by the backlight 10; a fixed grating 30 including an opening 31; a movable grating 40 disposed corresponding to the fixed grating 30 and in a bayonet (not shown); a sensing electrode 50 connected to the movable grating 40; a driving electrode 60 corresponding to the sensing electrode 50; a TFT switch 70 connected to the driving electrode 60; and a driving circuit 90 adapted for controlling the TFT switch 70. Driven by the TFT switch 70, the driving electrode 60 and the sensing electrode 50 drive the movable grating 40 to move in the horizontal direction. When the opening 31 of the fixed grating 30 is blocked by the movable grating 40, the lights emitted by the backlight 10 cannot pass through the opening 31; when the opening 31 of the fixed grating 30 is not blocked by the movable grating 40, the lights emitted by the backlight 10 can pass through the opening 31.

Therefore, in the conventional display device including a MEMS transmissive light valve, the TFT and MEMS transmissive light valve are generally formed on the glass substrate. The TFT is employed to control opening and closing of the MEMS transmissive light valve, so as to enable display. However, the driving circuit of the conventional display device needs to be formed in another chip, which may result in a big size of the display device. Besides, the manufacturing process of the display panel is not compatible with semiconductor manufacturing process, which means the display panel and the driving circuit cannot be manufactured in a same process, resulting in poor compatibility of the display device.

SUMMARY

A display device having a transmissive light valve and a method for forming the same are provided in the present disclosure. The method aims to solve the compatibility problem between a manufacturing process of a display panel and a semiconductor manufacturing process of a driving circuit. The problems of complex manufacturing process and high manufacturing cost in the conventional display device having TFT-MEMS transmissive light valves are also solved.

In order to solve the problems mentioned above, a method for forming a display device having a MEMS transmissive light valve is provided in the present disclosure. The method includes: providing a multilayer semiconductor substrate comprising a bottom semiconductor layer, a middle buried layer and a top semiconductor layer; forming a light guide opening in the top semiconductor layer; forming at least one MOS device in a remaining part of the top semiconductor layer; forming an interconnection layer and an interlayer dielectric layer on the at least one MOS device; forming a MEMS transmissive light valve, which is electrically connected to the interconnection layer, on the light guide opening, where the MEMS transmissive light valve is surrounded by the interlayer dielectric layer; forming a transparent backplane on a top surface of the interlayer dielectric layer; and removing the bottom semiconductor layer.

In some embodiments, the step of forming a light guide opening includes: removing a part of the top semiconductor layer by dry or wet etching to form a light-guide-opening reserved hole; and filling the light-guide-opening reserved hole with a transparent dielectric material to form the light guide opening.

In some embodiments, the transparent backplane is bonded or cemented to the top surface of the interlayer dielectric layer.

In some embodiments, a light guide plate is formed on a side of the transparent backplane facing the MEMS transmissive valve, where the light guide plate is a vertical-incident-light guide plate.

In some embodiments, a light guide plate is formed on a side of the transparent backplane facing the MEMS transmissive valve, where the light guide plate is a lateral-incident-light guide plate.

In some embodiments, the lateral-incident-light guide plate is a micro reflecting mirror, and is vertically aligned with the MEMS transmissive light valve.

In some embodiments, the multilayer semiconductor substrate is a silicon on insulator (SOI) substrate.

In some embodiments, the step for forming a MEMS transmissive light valve includes: forming a sacrificial layer on the light guide opening; forming the MEMS transmissive light valve in the sacrificial layer; removing the sacrificial layer after the bottom semiconductor layer is removed.

In one embodiment, a display device having a MEMS transmissive light valve is provided. The display device includes: a multilayer semiconductor substrate including a bottom semiconductor layer, a middle buried layer and a top semiconductor layer, where the top semiconductor layer includes a light guide opening therein; at least one MOS device formed in the top semiconductor layer; an interconnection layer and an transparent interlayer dielectric layer formed on the at least one MOS device; a MEMS transmissive light valve formed on the light guide opening, where the MEMS transmissive light valve is electrically connected to the interconnection layer and disposed in a cavity formed by the transparent interlayer dielectric layer; and a transparent backplane formed on a top surface of the transparent interlayer dielectric layer which is on the top of the cavity.

In some embodiments, a light guide plate is formed on a side of the transparent backplane facing the MEMS transmissive valve, where the light guide plate is a vertical-incident-light guide plate.

In some embodiments, a light guide plate is formed on a side of the transparent backplane facing the MEMS transmissive valve, where the light guide plate is a lateral-incident-light guide plate.

In some embodiments, the lateral-incident-light guide plate is a micro reflecting mirror, and is vertically aligned with the MEMS transmissive light valve.

In some embodiments, the multilayer semiconductor substrate is a silicon on insulator (SOI) substrate.

Forming the driving circuit and the MEMS transmissive light valve on the SOI substrate can effectively reduce leakage current, and improve performance and reliability of the circuit.

In addition, the method of the present disclosure can improve performance of the driving circuit and alignment accuracy between sensing units, simplify manufacturing process, optimize device performance, shorten manufacturing cycle, decrease device size, and reduce manufacturing cost.

DETAILED DESCRIPTION

In order to clarify the objects of the disclosure, the embodiments of the present disclosure will be described in detail in conjunction with the accompanying drawings.

Figure 2:
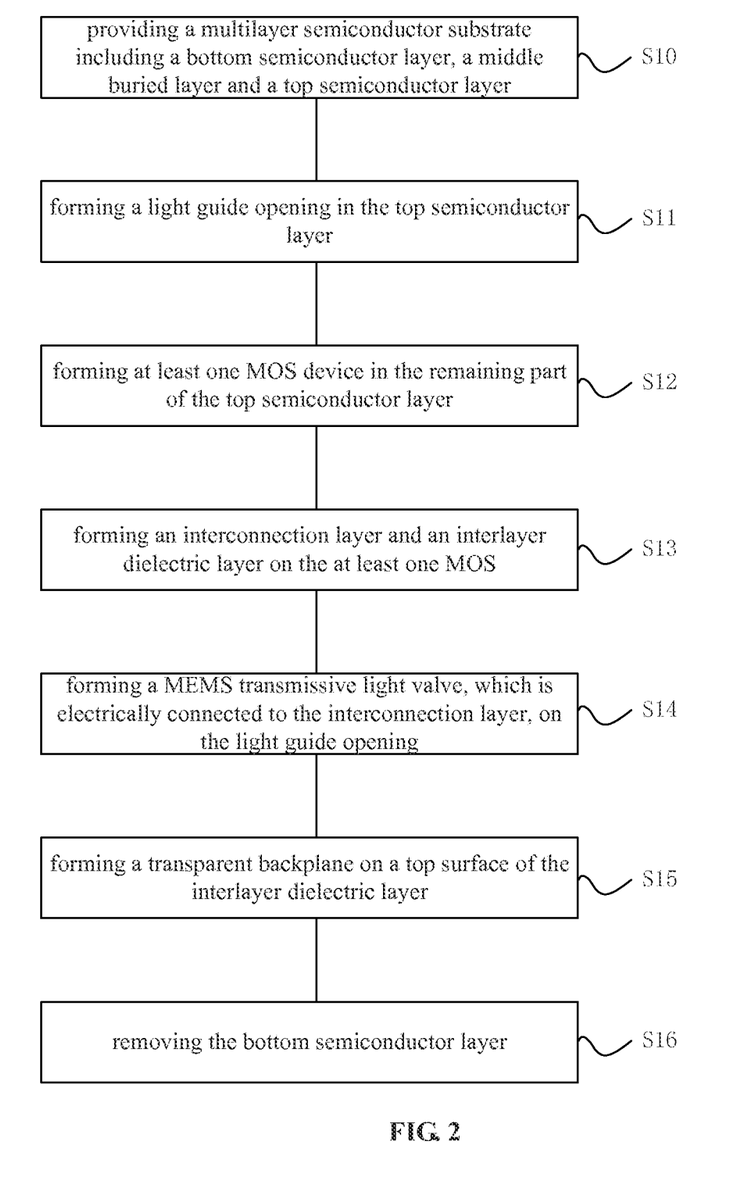
FIG. 2 illustrates a schematic flow chart of a method for forming a display device having a transmissive light valve according to one embodiment of the present disclosure.

A method for forming a display device having a MEMS transmissive valve is provided in embodiments of the present disclosure. FIG. 2 illustrates a schematic flow chart of a method for forming a display device having a MEMS transmissive valve according to one embodiment of the present disclosure. As shown in FIG. 2, the method includes:

S10, providing a multilayer semiconductor substrate including a bottom semiconductor layer, a middle buried layer and a top semiconductor layer;

S11, forming a light guide opening in the top semiconductor layer;

S12, forming at least one MOS device in the remaining part of the top semiconductor layer;

S13, forming an interconnection layer and an interlayer dielectric layer on the at least one MOS;

S14, forming a MEMS transmissive light valve, which is electrically connected to the interconnection layer, on the light guide opening, where the MEMS transmissive light valve is surrounded by the interlayer dielectric layer;

S15, forming a transparent backplane on a top surface of the interlayer dielectric layer; and S16, removing the bottom semiconductor layer.

In one embodiment of the present disclosure, a method for forming a MEMS transmissive light valve includes: depositing a first sacrificial layer on the interconnection layer; forming a movable grating on the first sacrificial layer, and forming a first sealing ring on a periphery of the first sacrificial layer and the movable grating; forming a second sacrificial layer on the first sacrificial layer; forming a fixed grating corresponding to the movable grating on the second sacrificial layer, and forming a second sealing ring on a periphery of the second sacrificial layer and the fixed grating; forming a cap on the top of the fixed grating and the second sealing ring; removing the first sacrificial layer and the second sacrificial layer after formation of a transparent backplane; and sealing the cap.

The multilayer semiconductor substrate is a SOI substrate. The bottom semiconductor layer is made of silicon, the middle buried layer is made of silicon oxide, and the top semiconductor layer is made of silicon.

In one embodiment of the present disclosure, a driving circuit is formed in the top semiconductor layer. The driving circuit may include one of the at least one MOS device, or a plurality of MOS devices which are electrically connected.

A grating electrode and a driving electrode are formed in the first sacrificial layer and the second sacrificial layer. The grating electrode and the movable grating are electrically connected, and the driving electrode and the MOS device are electrically connected.

The MOS device is electrically connected to the MEMS transmissive light valve, and provides an electrical signal to the MEMS transmissive light valve through the driving circuit, so as to control relative position between the movable grating and the fixed grating in the MEMS transmissive light valve. When a potential difference presents between the driving electrode and the grating electrode, the movable grating may move relative to the fixed grating along the direction of the driving electrode.

The transparent backplane is adhered to a top surface of the transparent interlayer dielectric layer on a cavity with bonding or a binder.

A light guide plate is formed in the transparent backplane, where the light guide plate is disposed on a side of the transparent backplane facing the MEMS transmissive valve.

In one embodiment of the present disclosure, after removing of the bottom semiconductor layer, a micro lens layer is formed on an outside surface of the middle buried layer.

In another embodiment of the present disclosure, after removing of the bottom semiconductor layer, a light filter layer and a micro lens layer are successively formed on an outside surface of the middle buried layer.

Removing the bottom semiconductor layer, also known as substrate thinning, may be implemented by mechanical polishing, CMP, dry etching or wet etching. A preferred substrate thinning method includes: thinning a 725 µm thick bottom semiconductor layer to about 50 µm by mechanical polishing; thinning the about 50 µm thick bottom semiconductor layer to about 10 µm by CMP, wherein in the CMP process, defects formed in the mechanical polishing process can be effectively removed, in order to avoid breaking the bottom semiconductor layer in following processes; and performing a dry etching or a wet etching to remove the remaining part of the bottom semiconductor layer to expose the middle buried layer. Because the dry etching and the wet etching have a high etching selectivity, the middle buried layer may be little damaged, and a smoother surface may be obtained.

A display device having a MEMS transmissive light valve is provided in embodiments of the present disclosure. The display device includes: a multilayer semiconductor substrate including a bottom semiconductor layer, a middle buried layer and a top semiconductor layer, where the top semiconductor layer includes a light guide opening therein; at least one MOS device formed in the top semiconductor layer; an interconnection layer and an interlayer dielectric layer formed on the at least one MOS device; a MEMS transmissive light valve formed on the light guide opening, where the MEMS transmissive light valve is electrically connected to the interconnection layer and disposed in a cavity formed by the interlayer dielectric layer; and a transparent backplane formed on a top surface of the transparent interlayer dielectric layer which is on the top of the cavity.

In one embodiment, the MEMS transmissive light valve includes a movable grating, a grating electrode electrically connected to the movable grating, a driving electrode corresponding to the grating electrode and a fixed grating corresponding to the movable grating.

A driving circuit constituted by the at least one MOS device is formed in the top semiconductor layer. Electrodes of the at least one MOS device are electrically connected to the driving electrode. The driving circuit may include a MOS device, or a plurality of MOS devices.

The at least one MOS device is electrically connected to the MEMS transmissive light valve, and provides an electrical signal to the MEMS transmissive light valve through the driving circuit, so as to control relative position between the movable grating and the fixed grating in the MEMS transmissive light valve. When a potential difference presents between the driving electrode and the grating electrode, the movable grating may move relative to the fixed grating along the direction of the driving electrode.

The MEMS transmissive light valve and the driving circuit are electrically connected to a storage capacitor. The storage capacitor has two plates, where one plate is connected to the MEMS transmissive light valve and the driving circuit, and the other is connected to ground.

The material of the interconnection layer includes conductive metal or conductive nonmetal. In an embodiment, a light guide plate is formed on a side of the transparent backplane facing the MEMS transmissive valve, where the light guide plate is a vertical-incident-light guide plate.

In one embodiment, a light guide plate is formed on a side of the transparent backplane facing the MEMS transmissive valve, where the light guide plate is a lateral-incident-light guide plate. The lateral-incident-light guide plate is a micro reflecting mirror, and is vertically aligned with the MEMS transmissive light valve.

As described in the background, the manufacturing process of the display device is not compatible with the manufacturing process of the driving circuit and semiconductor manufacturing process. The method of the present disclosure aims to solve the compatibility problem between the manufacturing process of the display device, and the manufacturing process of the driving circuit and semiconductor manufacturing process. The embodiments of the present disclosure will be described in detail in conjunction with the accompanying drawings.

Figure 3:
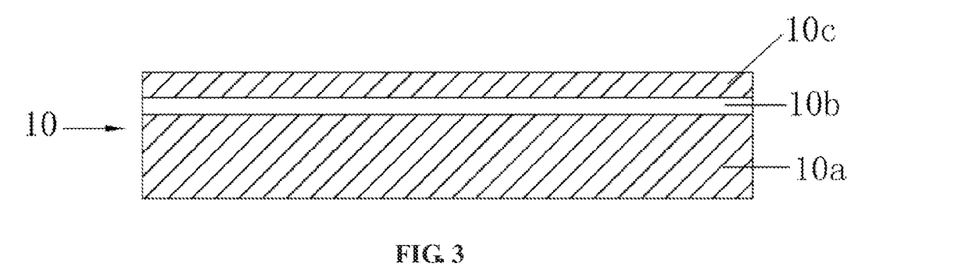
FIGS. 3-20 schematically illustrate intermediate structural diagrams of a method for forming a display device having a transmissive light valve according to one embodiment of the present disclosure.

As shown in FIG. 3, a substrate 10 is a Silicon-On-Insulator (SOI) substrate including a bottom silicon layer 10a, a buried oxide layer 10b and a top silicon layer 10c from bottom to top. In one embodiment, the buried oxide layer may have a thickness ranged from 50 nm to 10 μm, and the top silicon layer may have a thickness ranged 10 nm to 10 μm.

Figure 4:
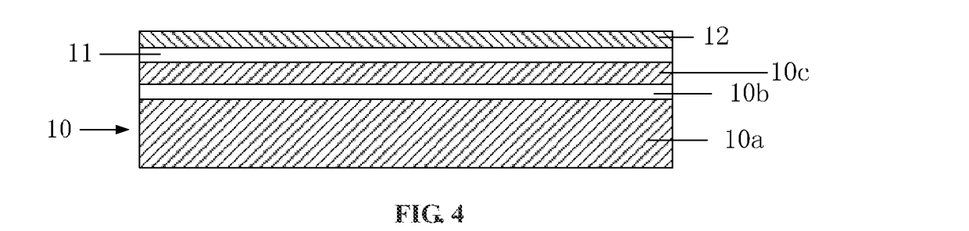
Figure 5:
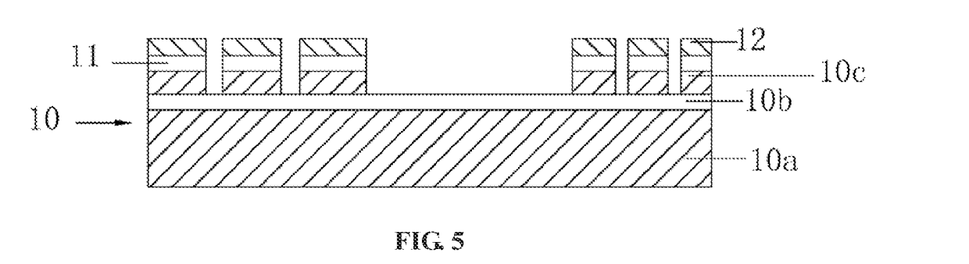
Figure 6:
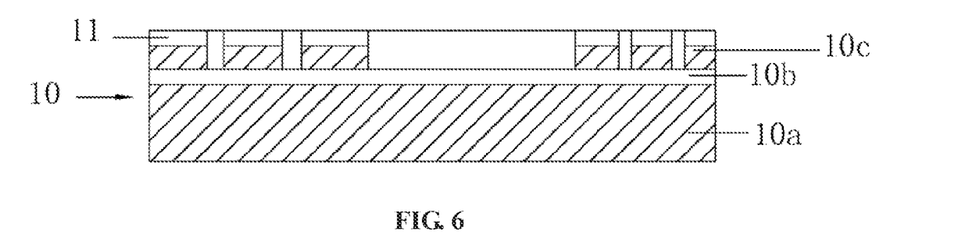

FIGS. 4-6 schematically illustrate intermediate structures of a method for forming a Shallow Trench Isolation (STI) on the SOI substrate. As shown in FIG. 4, an isolation oxide layer is formed and nitride is deposited. Specifically, after being sent to a diffusion region, the substrate 10 is cleaned to remove contamination and oxide. Then the substrate 10 is rinsed and dried. Thereafter, the substrate 10 is sent to a high-temperature oxidation equipment, an oxide layer 11 with a thickness of 15 nm is grown on the top silicon layer 10c, and a thin silicon nitride layer 12 is grown on a surface of the oxide layer 11.

Figure 7:
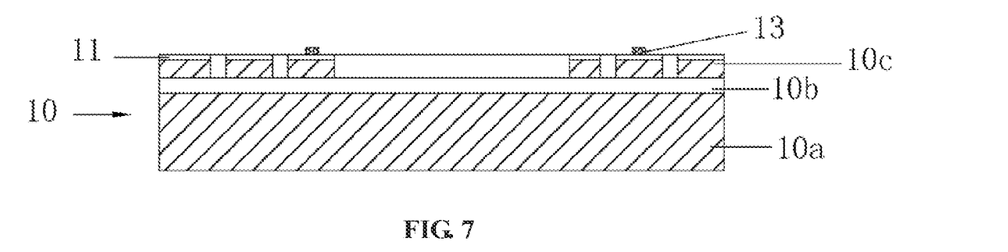

As shown in FIG. 5, STIs are formed by etching. As shown in FIG. 6, a liner oxide layer is grown and an oxide layer is filled in the STIs. Then a Chemical Mechanical Polishing (CMP) process is performed. Schematic structural diagram of forming a MOS device on the substrate 10 is illustrated in FIG. 7. In an embodiment, a process for forming the MOS device includes: depositing a polysilicon layer 13 with a thickness ranging from 100 nm to 1000 nm on the substrate 10; etching the polysilicon layer 13 to form fine structures of polysilicon gates by etching; and then performing lithography, masking and implantation to form source and drain of the MOS device.

Figure 8:
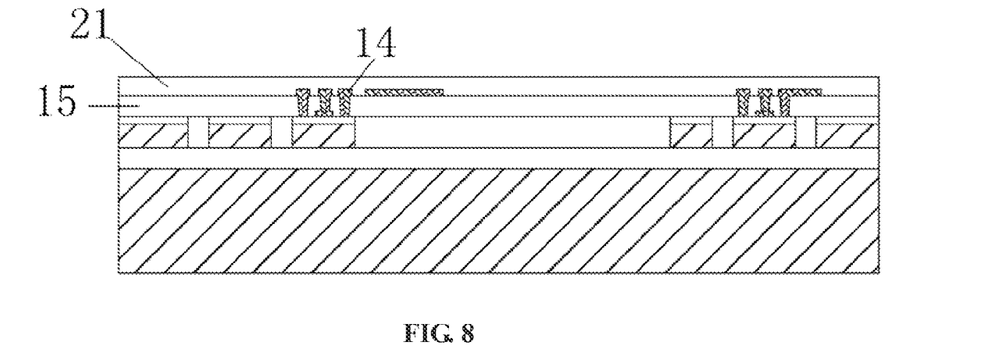

As shown in FIG. 8, a first metal interconnection layer 14 is formed on the MOS devices. In an embodiment, a process for forming the first metal interconnection layer 14 includes: depositing a first transparent interlayer dielectric layer 15 on the MOS devices by Chemical Vapor Deposition (CVD); etching to form grooves, where the grooves defines a path of local interconnection metal; forming tungsten plugs in the grooves which are locally interconnected; and depositing the first metal interconnection layer 14 on the first transparent interlayer dielectric layer 15. Then a second transparent interlayer dielectric layer 21 is deposited on the first metal interconnection layer 14.

Figure 9:
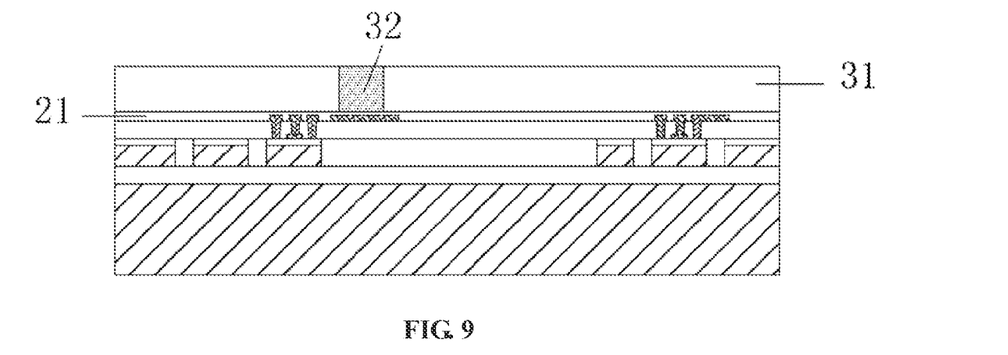

As shown in FIG. 9, a third transparent interlayer dielectric layer 31 is deposited on the second transparent interlayer dielectric layer 21. The third transparent interlayer dielectric layer is thicker than the second transparent interlayer dielectric layer. Then lithography and etching processes are performed to form a groove in the third transparent interlay dielectric layer 31. The groove is formed on one side of the MOS device. Then a first sacrificial layer 32 is deposited in the groove by CVD. Then CMP is performed to make the first sacrificial layer 32 be flush with the third transparent interlayer dielectric layer 31. In an embodiment, material of the first sacrificial layer is amorphous carbon.

Figure 10:
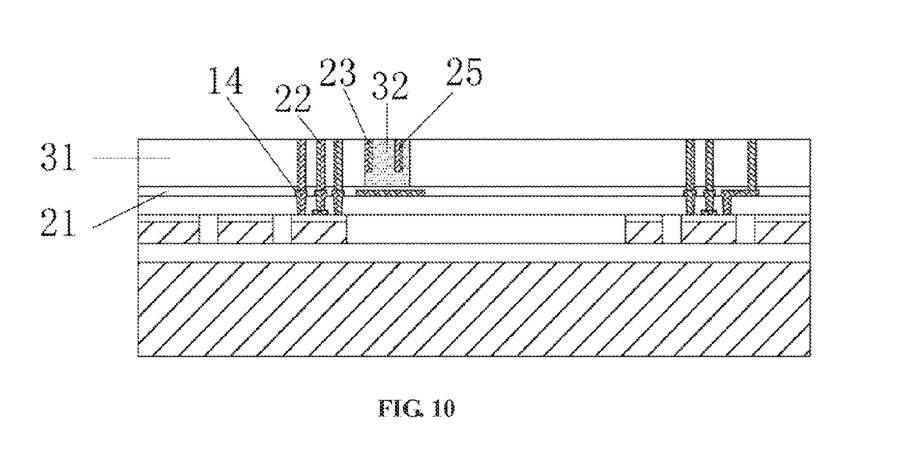

As shown in FIG. 10, a second metal via and a second metal plug 22 are formed in the second transparent interlay dielectric layer 21 and the third transparent interlayer dielectric layer 31. The second metal plug 22 is formed in the second metal via.

Figure 11:
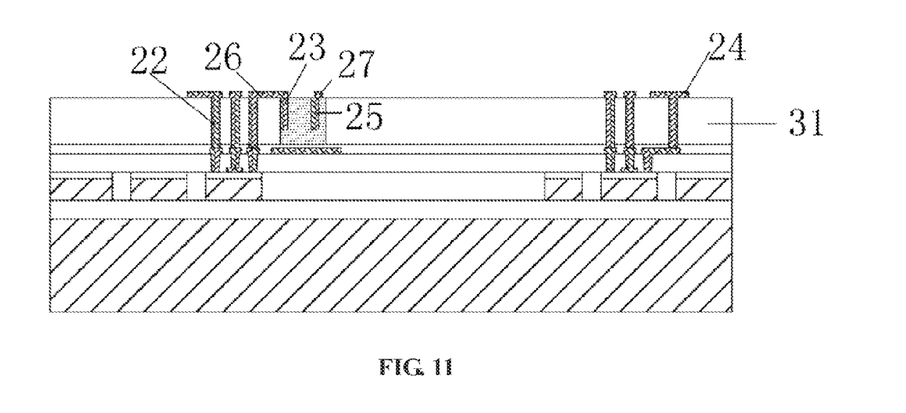

As shown in FIG. 11, a second metal interconnection layer 24 is deposited on the third transparent interlayer dielectric layer 31. Then lithography using a photo mask, and etching are performed to obtain a required metal interconnection pattern. The second metal interconnection layer 24 and the second metal plug 22 in the second metal via are connected. In addition, a first metal pressure point 26 of the second metal interconnection layer 24 is connected to a driving electrode 23, and a second metal pressure point 27 is connected to a grating electrode 25.

Figure 12:
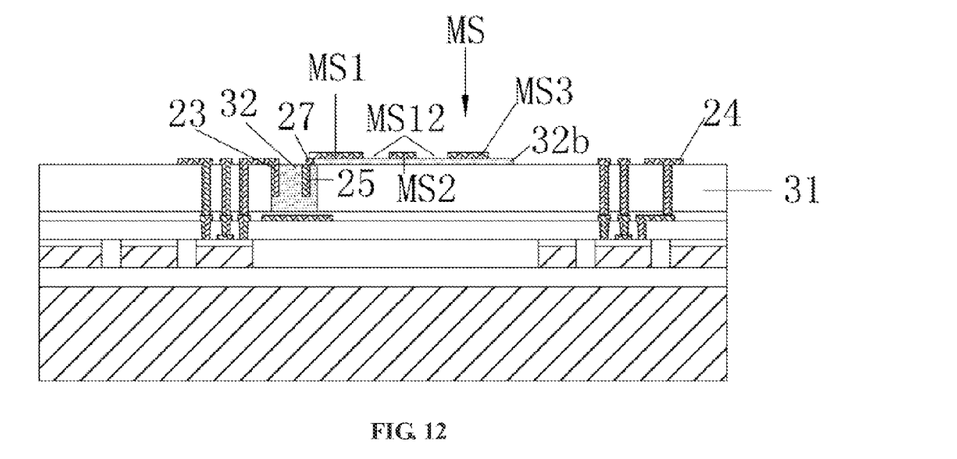

As shown in FIG. 12, a second sacrificial layer 32b is deposited on the third transparent interlayer dielectric layer 31 by CVD. A photoresist layer is formed on the second sacrificial layer 32b, and then the photoresist layer is patterned. With the patterned photoresist as a mask, a portion of the second sacrificial layer 32b which is not covered by the patterned photoresist layer is removed by etching, so as to form a patterned second sacrificial layer 32b with a predetermined pattern. In one embodiment, a left end of the patterned second sacrificial layer is connected to a right end of the metal pressure point 27 and a top right end surface of the first sacrificial layer 32. In some embodiments, the patterned second sacrificial layer may not be connected to the right end of the metal pressure point 27 and the top right end surface of the first sacrificial layer 32. Then, a metal layer is deposited. The metal layer covers a top surface of the second sacrificial layer 32b. The metal layer is etched to form a movable grating MS disposed on one side of the metal pressure point 27, and a first sealing ring (not shown in FIG. 12) is formed at the periphery of the patterned second sacrificial layer 32b and the movable grating MS. The movable grating includes the driving electrode 23, the grating electrode 25 and movable parts (MS1, MS2 and MS3). Gaps MS12 between the movable parts (MS1, MS2 and MS3) of the movable grating may serve as transparent parts of the movable grating MS. The grating electrode 25 and the movable parts (MS1, MS2 and MS3) of the movable grating are electrically connected.

Figure 13:
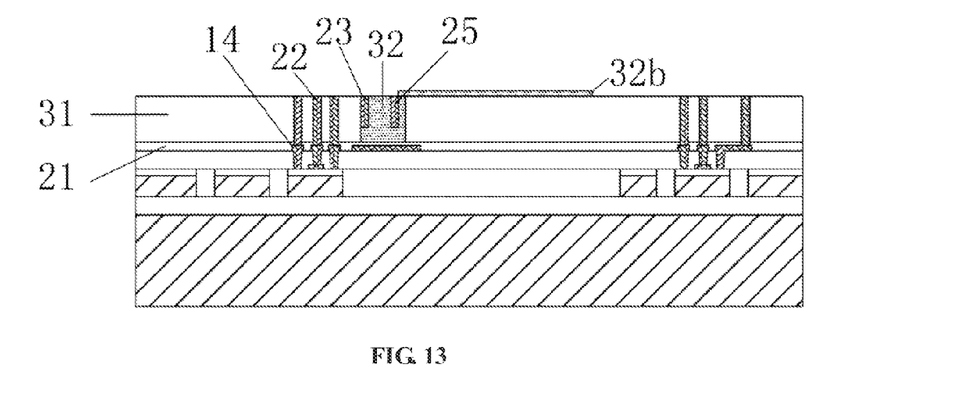
Figure 14:
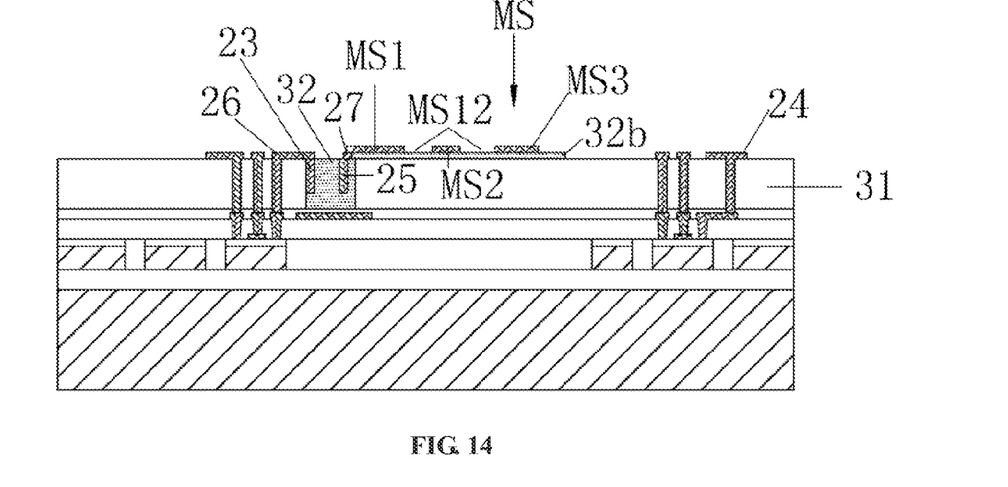

In some embodiments, as shown in FIG. 13 and FIG. 14, a second sacrificial layer 32b is formed to cover a surface of the third transparent interlayer dielectric layer 31 first. A photoresist layer is formed on the second sacrificial layer, and then the photoresist layer is patterned. With the patterned photoresist layer as a mask, a portion of the second sacrificial layer which is not covered by the patterned photoresist is removed by etching, so as to form a patterned second sacrificial layer 32b with a predetermined pattern. A second metal layer 24 is deposited on a surface of the third transparent dielectric layer 31. Then lithography using a photo mask, and etching processes are performed to obtain a desired metal interconnection pattern. The second metal interconnection layer 24 and the second metal plug 22 in the second metal via are connected. In addition, a first metal pressure point 26 of the second metal interconnection layer 24 is connected to a driving electrode 23, and a second metal pressure point 27 is connected to a grating electrode 25. In one embodiment, a left end of the second sacrificial layer is connected to a right end of the metal pressure point 27 and a top right end surface of the first sacrificial layer 32. In some embodiments, the second sacrificial layer may be not connected to the left right end of the metal pressure point 27 and the top right end surface of the first sacrificial layer 32. A movable grating MS disposed on one side of the metal pressure point 27 is formed while forming the second metal interconnection layer 24, and a first sealing ring (not shown in FIG. 13 and FIG. 14) is formed at the periphery of the second sacrificial layer 32b and the movable grating MS. The movable grating MS includes a driving electrode 23, a grating electrode 25 and movable parts (MS1, MS2 and MS3). Gaps MS 12 between the movable parts (MS1, MS 2, MS3) of the movable grating may serve as transparent parts of the movable grating MS. The grating electrode 25 and the movable parts (MS1, MS2 and MS3) of the movable grating are electrically connected.

Figure 15:
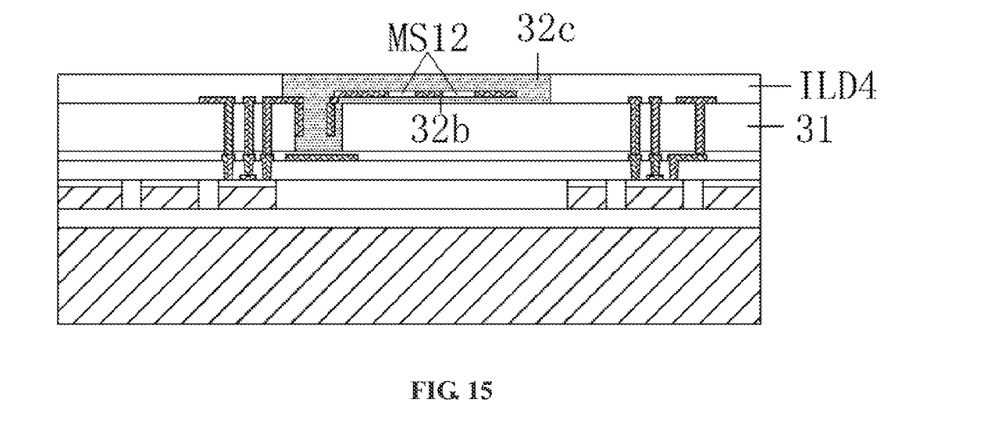

As shown in FIG. 15, a fourth transparent interlayer dielectric layer ILD4 is deposited and a third sacrificial layer 32c is formed. Specifically, the fourth transparent interlayer dielectric layer ILD4 is deposited on the third transparent interlayer dielectric layer 32 by CVD, and a CMP process is performed on the fourth transparent interlayer dielectric layer ILD4. A photoresist layer is formed on a surface of the fourth transparent interlayer dielectric layer ILD4, and then the photoresist is patterned. With the patterned photoresist as a mask, a portion of the fourth transparent interlayer dielectric layer ILD4 which is not covered by the patterned photoresist layer is removed by etching, so as to form a patterned fourth transparent interlayer dielectric layer ILD4 with a predetermined pattern. A thickness of the patterned fourth transparent interlayer dielectric layer ILD4 is greater than that of the second sacrificial layer 32b and the gaps MS12 of the movable grating. Then, the third sacrificial layer 32c is formed to cover a top surface of the patterned fourth transparent interlayer dielectric layer ILD4 by CVD. CMP is then performed on the third sacrificial layer 32c to make it be flush with the patterned fourth transparent interlayer dielectric layer ILD4, whereby a globally planarized surface may be obtained.

Figure 16:
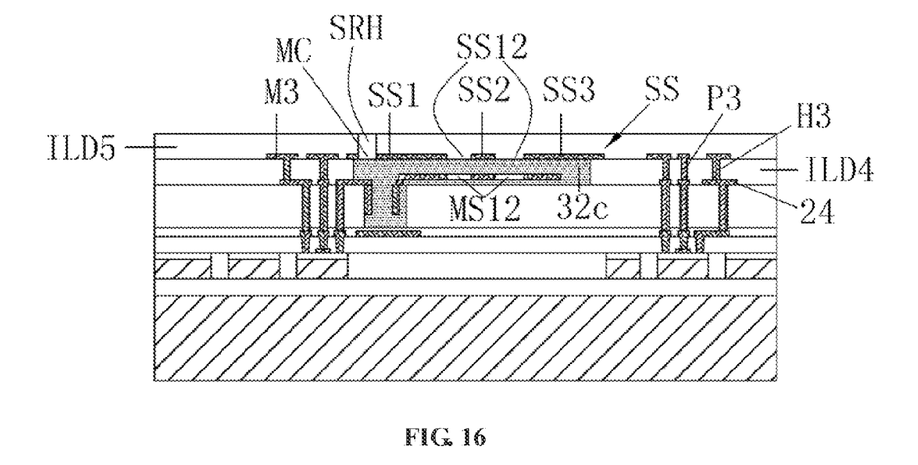

As shown in FIG. 16, a fixed grating SS is formed. In an embodiment, a method for forming the fixed grating includes: forming a photoresist layer on a surface of the third sacrificial layer 32c and the patterned fourth transparent interlayer dielectric layer ILD4; patterning the photoresist layer; etching to form a third metal via H3 with the patterned photoresist layer as a mask, wherein the third metal via H3 is in contact with the second metal interconnection layer 24; depositing a third metal plug P3 and a third metal interconnection layer M3; performing CMP on the third metal interconnection layer M3; forming a photoresist layer on the third metal interconnection layer M3 and patterning the photoresist layer; etching to remove a part of the metal interconnection layer M3 which is not covered by the patterned photoresist layer, so that the third metal interconnection layer M3 may be electrically connected to the third metal plug P3 in the third metal via H3; forming a second sealing ring (not shown) at the periphery of the third sacrificial layer 32c and the fixed grating SS, wherein gaps SS12 between fixed parts (SS1, SS2 and SS3) of the fixed grating SS serve as transparent parts of the fixed grating SS, the gaps SS12 in the fixed grating and the gaps MS12 in the movable grating are vertical aligned with each other, the patterned third metal interconnection layer M3 has a groove MC which is disposed close to the top surface of the third sacrificial layer 32c and serves as a release channel of sacrificial layers; depositing a fifth transparent interlayer dielectric layer ILD5 on the top of the fixed grating SS and the second sealing ring by CVD, so as to form a cap; and forming a sacrificial layer release hole SRH in the fifth transparent interlayer dielectric layer ILD5, wherein the sacrificial layer release hole SRH is aligned with the groove MC.

The above is just embodiments of the present disclosure. In other embodiments, the fixed grating may be formed firstly, and then the movable grating may be formed on the top of the fixed grating. Other embodiments are possible.

Figure 17:
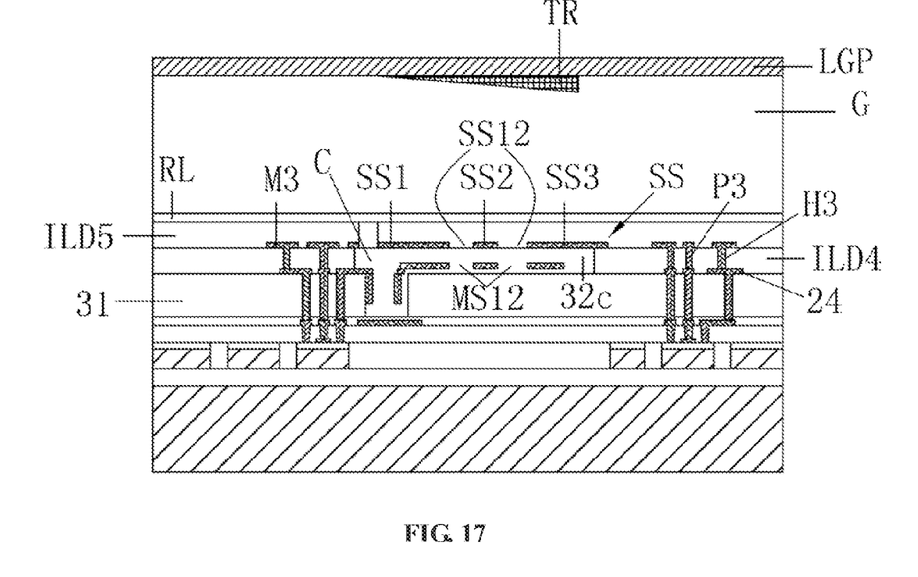

As shown in FIG. 17, a sealing layer RL is formed on a surface of the fifth transparent interlayer dielectric layer ILD5. A transparent backplane G is bonded on the seal layer RL. A light guide plate may be formed in the transparent backplane G. In one embodiment, the light guide plate is a triangular reflecting mirror TR disposed right above the fixed grating SS. The reflecting mirror is adapted for reflecting lights in a horizontal or near-horizontal direction to pass through the fixed grating SS in a vertical or near-vertical direction. In addition, a polymer light guide plate LGP is disposed on a top surface of the transparent backplane G. The polymer light guide plate LGP may serve as a mechanical support structure after the bottom silicon layer 10a is removed. The persons skilled in the art should know that, for better use of incident light and better display effect, refractive indexes of the polymer light guide plate LGP and the transparent interlayer dielectric layers should be optimized in order to achieve total reflection at a small incident angle and partial reflection at a large incident angle. In some embodiments, a binder is used to cement the transparent backplane G on the sealing layer RL. The binder may be known to the persons skilled in the art, and is not described in detail herein.

Figure 18:
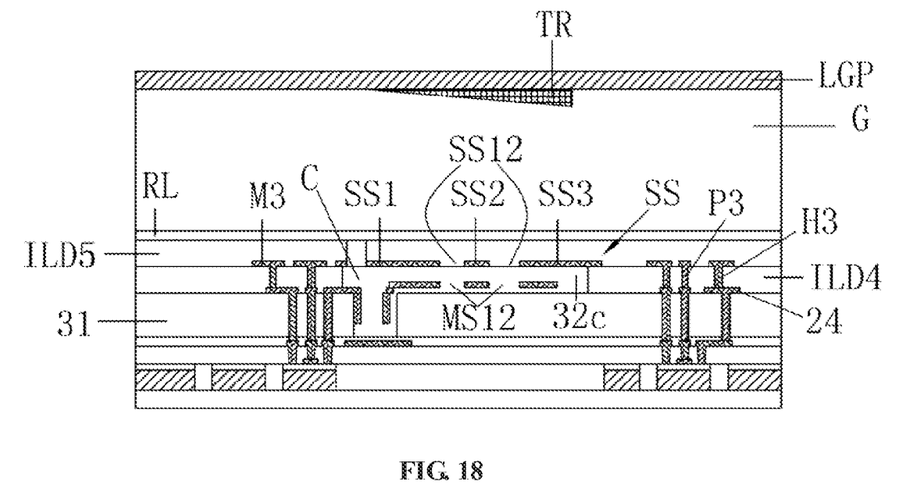

As shown in FIG. 18, the bottom silicon layer 10a of the substrate 10 is removed. CMP is performed to remove the bottom silicon layer 10a and polish the buried oxide layer 10b, so that the surface of the buried oxide layer 10b may have a roughness less than 10 nm or further less than 1 nm, and a globally planarized surface may be obtained, which is beneficial for light transmitting and obtaining a better display effect. The persons skilled in the art should known that, CMP may be used to remove the bottom silicon layer to obtain a planarized surface, or a dry etching or a wet etching may be used to remove most of the bottom silicon layer and then CMP is used to remove the remained bottom silicon 10a to obtain a planarized surface.

Then the first sacrificial layer 32, the second sacrificial layer 32b and the third sacrificial layer 32c are removed by dry etching to form a cavity between the third transparent interlayer dielectric layer 31 and the fixed grating SS. In one embodiment, the buried oxide layer 10b, the top silicon 10c, the oxide layer 11 and the nitride silicon layer 12 are etched to form an opening exposed the first sacrificial layer 32. The opening is used to remove the first sacrificial layer 32, the second sacrificial layer 32b and the third sacrificial layer 32c. Then a cap is formed to seal the opening.

In embodiments of the present disclosure, the sacrificial layers are removed at last. After formation of the transparent backplane, the transparent backplane serves as a supporting substrate. Then a release opening is formed by removing the bottom semiconductor layer with a fine polishing process and etching the substrate and the dielectric filling layer (SiO$_2$), where the release opening is used to remove carbon and release MEMS structure. The purpose of removing the sacrificial layers at last is to avoid damaging the MEMS device when the transparent backplane is bonded as the supporting substrate.

In some embodiments, the transparent backplane is bonded after the first sacrificial layer, the second sacrificial layer and the third sacrificial layer are removed.

Figure 19:
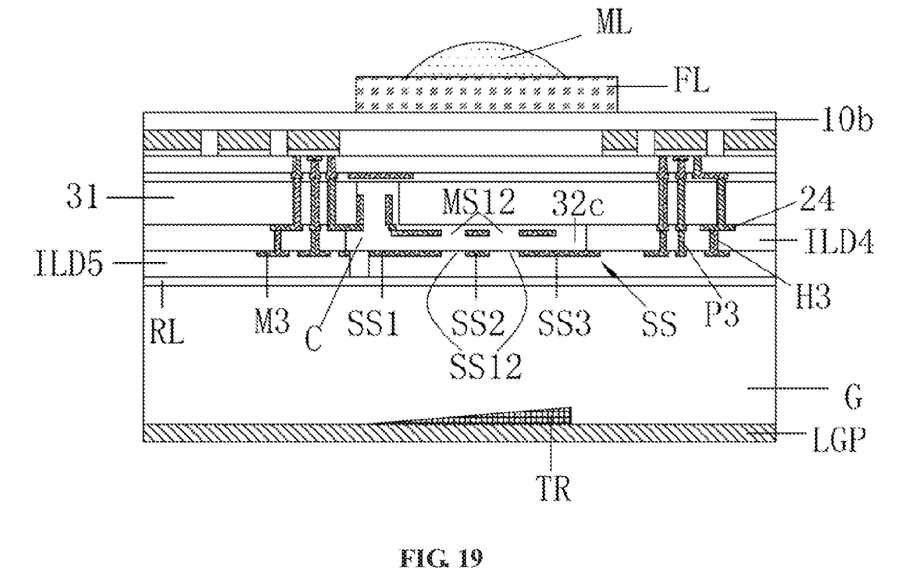

As shown in FIG. 19, a light filter layer FL and a micro lens ML are successively formed on the polished buried oxide layer 10b in order to increase convergence and absorption of the incident light. The structure and the manufacturing method of the light filter layer FL and the micro lens ML are well known to persons skilled in the art. In some embodiments, other structures and other manufacturing methods can be adopted. For example, the light filter layer FL may be classified into three types: R, G and B, which may be arranged in a rectangular shape, a triangular shape, a quincuncial shape, or other regular or irregular shapes. The persons skilled in the art should know that, it is possible to form only the micro lens ML on the buried oxide layer 10b.

Figure 20:
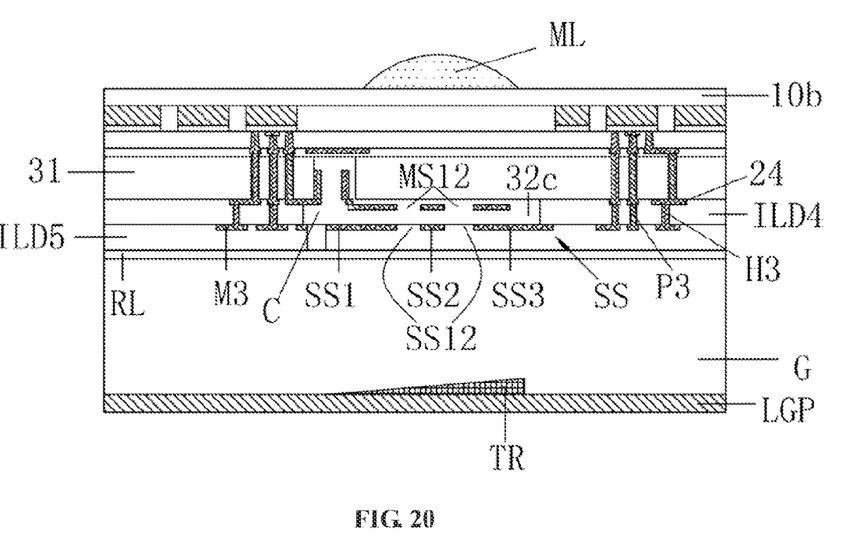

FIG. 20 schematically illustrates an optional structure of a display device according to one embodiment of the present disclosure. The difference is that only a micro lens ML is formed on the buried oxide layer 10b. Other components are the same, and are not described in detail herein.

The method for forming a display device having a MEMS transmissive light valve of embodiments of the present disclosure further includes: forming a storage unit. The storage unit may be a storage capacitor. The storage capacitor has two plates, where one plate is connected to the MEMS transmissive light valve and the driving circuit, the other is connected to ground.

In one embodiment, the driving circuit constituted by the MOS device provides an electric potential to the driving electrode in order to form a potential difference between the driving electrode and the grating electrode. If the potential difference ranges from 2V to 50V, an electrostatic force is generated between the driving electrode and the grating electrode. The electrostatic force can enable a movable part of the movable grating to move to the driving electrode, and generate a relative displacement between the movable grating and the fixed grating disposed corresponding to the movable grating. By controlling the relative position between the movable grating and the fixed grating, lights transmitted through the fixed grating are controllable.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A method for forming a display device having a MEMS transmissive light valve, comprising:
   providing a multilayer semiconductor substrate comprising a bottom semiconductor layer, a middle buried layer and a top semiconductor layer;
   forming a light guide opening in the top semiconductor layer, wherein the light guide opening is formed by filling a transparent dielectric material into a light-guide-opening reserved hole;
   forming at least one MOS device in a remaining part of the top semiconductor layer;
   forming an interconnection layer and an interlayer dielectric layer on the at least one MOS device;
   forming a MEMS transmissive light valve, which is electrically connected to the interconnection layer, on the light guide opening, where the MEMS transmissive light valve is surrounded by the interlayer dielectric layer;
   forming a transparent backplane on a top surface of the interlayer dielectric layer; and
   removing the bottom semiconductor layer.

2. The method for forming the display device having the MEMS transmissive light valve according to claim 1, wherein the forming the light guide opening comprises:
   removing a part of the top semiconductor layer by dry or wet etching to form the light-guide-opening reserved hole; and
   filling the light-guide-opening reserved hole with the transparent dielectric material to form the light guide opening.

3. The method for forming the display device having the MEMS transmissive light valve according to claim 1, wherein the transparent backplane is bonded or cemented to the top surface of the interlayer dielectric layer.

4. The method for forming the display device having the MEMS transmissive light valve according to claim 1, wherein a light guide plate is formed on a side of the transparent backplane facing the MEMS transmissive valve, where the light guide plate is a vertical-incident-light guide plate.

5. The method for forming the display device having the MEMS transmissive light valve according to claim 1, wherein a light guide plate is formed on a side of the transparent backplane facing the MEMS transmissive valve, where the light guide plate is a lateral-incident-light guide plate.

6. The method for forming the display device having the MEMS transmissive light valve according to claim 5, wherein the lateral-incident-light guide plate is a micro reflecting mirror, and is vertically aligned with the MEMS transmissive light valve.

7. The method for forming the display device having the MEMS transmissive light valve according to claim 1, wherein the multilayer semiconductor substrate is a silicon on insulator (SOI) substrate.

8. The method for forming the display device having the MEMS transmissive light valve according to claim 1, wherein the forming the MEMS transmissive light valve comprises: forming a sacrificial layer on the light guide opening; forming the MEMS transmissive light valve in the sacrificial layer; and removing the sacrificial layer after the bottom semiconductor layer is removed.

9. A display device having a MEMS transmissive light valve, formed according to the method of claim 1, comprising:
   a multilayer semiconductor substrate comprising a bottom semiconductor layer, a middle buried layer and a top semiconductor layer, where the top semiconductor layer comprises a light guide opening therein, and the light guide opening is formed by filling a transparent dielectric material into a light-guide-opening reserved hole;
   at least one MOS device formed in the top semiconductor layer;
   an interconnection layer and an transparent interlayer dielectric layer formed on the at least one MOS device;
   a MEMS transmissive light valve formed on the light guide opening, where the MEMS transmissive light valve is electrically connected to the interconnection layer and disposed in a cavity formed by the transparent interlayer dielectric layer; and
   a transparent backplane formed on a top surface of the transparent interlayer dielectric layer which is on the top of the cavity.

10. The display device having the MEMS transmissive light valve according to claim 9, wherein a light guide plate is formed on a side of the transparent backplane facing the MEMS transmissive valve, where the light guide plate is a vertical-incident-light guide plate.

11. The display device having the MEMS transmissive light valve according to claim 9, wherein a light guide plate is formed on a side of the transparent backplane facing the MEMS transmissive valve, where the light guide plate is a lateral-incident-light guide plate.

12. The display device having the MEMS transmissive light valve according to claim 11, wherein the lateral-incident-light guide plate is a micro reflecting mirror, and is vertically aligned with the MEMS transmissive light valve.

13. The display device having the MEMS transmissive light valve according to claim 9, wherein the multilayer semiconductor substrate is a silicon on insulator (SOI) substrate.

\* \* \* \* \*